US012811101B2

(12) United States Patent
Takayama

(10) Patent No.: US 12,811,101 B2
(45) Date of Patent: Nov. 24, 2026

(54) PLASMA PROCESSING APPARATUS AND CONTROL METHOD

(71) Applicant: Tokyo Electron Limited, Tokyo (JP)

(72) Inventor: Takamitsu Takayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 66 days.

(21) Appl. No.: 19/074,563

(22) Filed: Mar. 10, 2025

(65) Prior Publication Data

US 2025/0210308 A1 Jun. 26, 2025

Related U.S. Application Data

(63) Continuation of application No. PCT/JP2024/034483, filed on Sep. 26, 2024.

(30) Foreign Application Priority Data

Sep. 29, 2023 (JP) ................................ 2023-169441

(51) Int. Cl.
*H01J 37/32* (2006.01)

(52) U.S. Cl.
CPC .. *H01J 37/32174* (2013.01); *H01J 37/32091* (2013.01); *H01J 37/32146* (2013.01); *H01J 37/32541* (2013.01); *H01J 37/32715* (2013.01); *H01J 37/32935* (2013.01)

(58) Field of Classification Search
CPC .......... H01J 37/32091; H01J 37/32146; H01J 37/32155; H01J 37/32165; H01J 37/32174; H01J 37/32449; H01J 37/32935
See application file for complete search history.

(56) References Cited

U.S. PATENT DOCUMENTS

| | | | | |
|---|---|---|---|---|
| 10,707,054 B1 * | 7/2020 | Kubota | H01J 37/32091 |
| 2009/0294061 A1 * | 12/2009 | Shannon | H01J 37/32183<br>118/723 MP |
| 2015/0325413 A1 * | 11/2015 | Kim | H01J 37/32082<br>315/111.21 |
| 2016/0056017 A1 * | 2/2016 | Kim | H01J 37/321<br>156/345.28 |

(Continued)

FOREIGN PATENT DOCUMENTS

JP 2010-171320 A 8/2010

*Primary Examiner* — Jason M Crawford
(74) *Attorney, Agent, or Firm* — XSENSUS LLP

(57) ABSTRACT

A plasma processing apparatus comprising: a chamber; a substrate support disposed in the chamber; an upper electrode disposed above the substrate support including a plurality of gas holes. In an ON period, a source radio-frequency power is supplied to a radio-frequency electrode from a radio-frequency power source, and an electric bias is supplied to the substrate support from control a first bias power source to in the ON period. A first negative voltage of which a voltage level has a first absolute value is applied from a second bias power source to the upper electrode in a first period of the ON period. A second negative voltage of which a voltage level has a second absolute value is applied from the second bias power source to the upper electrode in a second period of the ON period. The first absolute value is smaller than the second absolute value.

18 Claims, 8 Drawing Sheets

(56) References Cited

U.S. PATENT DOCUMENTS

| | | | | |
|---|---|---|---|---|
| 2016/0079037 | A1* | 3/2016 | Hirano | H01J 37/32183 156/345.28 |
| 2019/0122863 | A1* | 4/2019 | Nagaseki | H01J 37/32174 |
| 2020/0144028 | A1* | 5/2020 | Nagami | H01J 37/32027 |
| 2021/0335578 | A1* | 10/2021 | Nagami | H01J 37/32715 |
| 2022/0037120 | A1* | 2/2022 | Dorf | H01J 37/32128 |
| 2022/0037129 | A1* | 2/2022 | Koshimizu | H01J 37/32183 |
| 2022/0122810 | A1* | 4/2022 | Kubota | H01J 37/32091 |
| 2022/0384150 | A1* | 12/2022 | Koshimizu | H01J 37/32541 |
| 2024/0145218 | A1* | 5/2024 | Nagami | H01J 37/32137 |
| 2024/0222078 | A1* | 7/2024 | Tamamushi | H01J 37/32155 |
| 2024/0347320 | A1* | 10/2024 | Koshimizu | H01J 37/32165 |
| 2025/0014872 | A1* | 1/2025 | Koshimizu | H01J 37/32128 |
| 2025/0210308 | A1* | 6/2025 | Takayama | H01J 37/32174 |
| 2025/0226181 | A1* | 7/2025 | Iwano | H01J 37/32146 |

* cited by examiner

PLASMA PROCESSING APPARATUS AND CONTROL METHOD

CROSS-REFERENCE TO RELATED APPLICATIONS

The application is a Bypass Continuation application of PCT International Application No. PCT/JP2024/034483, filed on Sep. 26, 2024 and designating the United States, the international application being based upon and claiming the benefit of priority from Japanese Patent Application No. 2023-169441, filed on Sep. 29, 2023, the entire content of each are incorporated herein by reference.

TECHNICAL FIELD

The present disclosure relates to a plasma processing apparatus and a control method.

BACKGROUND

A plasma processing apparatus is used for plasma processing on a substrate. A capacitively coupled plasma processing apparatus is known as a kind of plasma processing apparatus. The capacitively coupled plasma processing apparatus includes a chamber, a substrate support, and an upper electrode. The substrate support is located in the chamber. The upper electrode is located above the substrate support. In a plasma processing apparatus described in Patent Document 1, a source radio-frequency power for plasma generation and a bias radio-frequency power for ion drawing-in are supplied in a pulse form to a substrate support, and a negative voltage is applied to an upper electrode.

PRIOR ART DOCUMENTS

Patent Documents

Patent Document 1: Japanese Patent Laid-Open Publication No. 2010-171320

SUMMARY

According to one embodiment of the present disclosure, there is provided a plasma processing apparatus including: a chamber; a substrate support disposed in the chamber; an upper electrode disposed above the substrate support, wherein a plurality of gas holes for introducing a gas into the chamber is formed in the upper electrode; a radio-frequency power source configured to be electrically coupled to a radio-frequency electrode which is the substrate support or the upper electrode, and generate a source radio-frequency power for generating plasma from the gas in the chamber; a first bias power source configured to be electrically coupled to the substrate support, and generate an electric bias for drawing ions in the chamber into a substrate on the substrate support; a second bias power source configured to apply a negative voltage to the upper electrode; and a controller. The controller is configured to: control the radio-frequency power source to supply the source radio-frequency power to the radio-frequency electrode in an ON period; control the first bias power source to supply the electric bias to the substrate support in the ON period; control the second bias power source to apply a first negative voltage of which a voltage level has a first absolute value to the upper electrode in a first period including a start time point of the ON period; and control the second bias power source to apply a second negative voltage of which a voltage level has a second absolute value to the upper electrode in a second period after the first period in the ON period, and wherein the first absolute value is smaller than the second absolute value.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
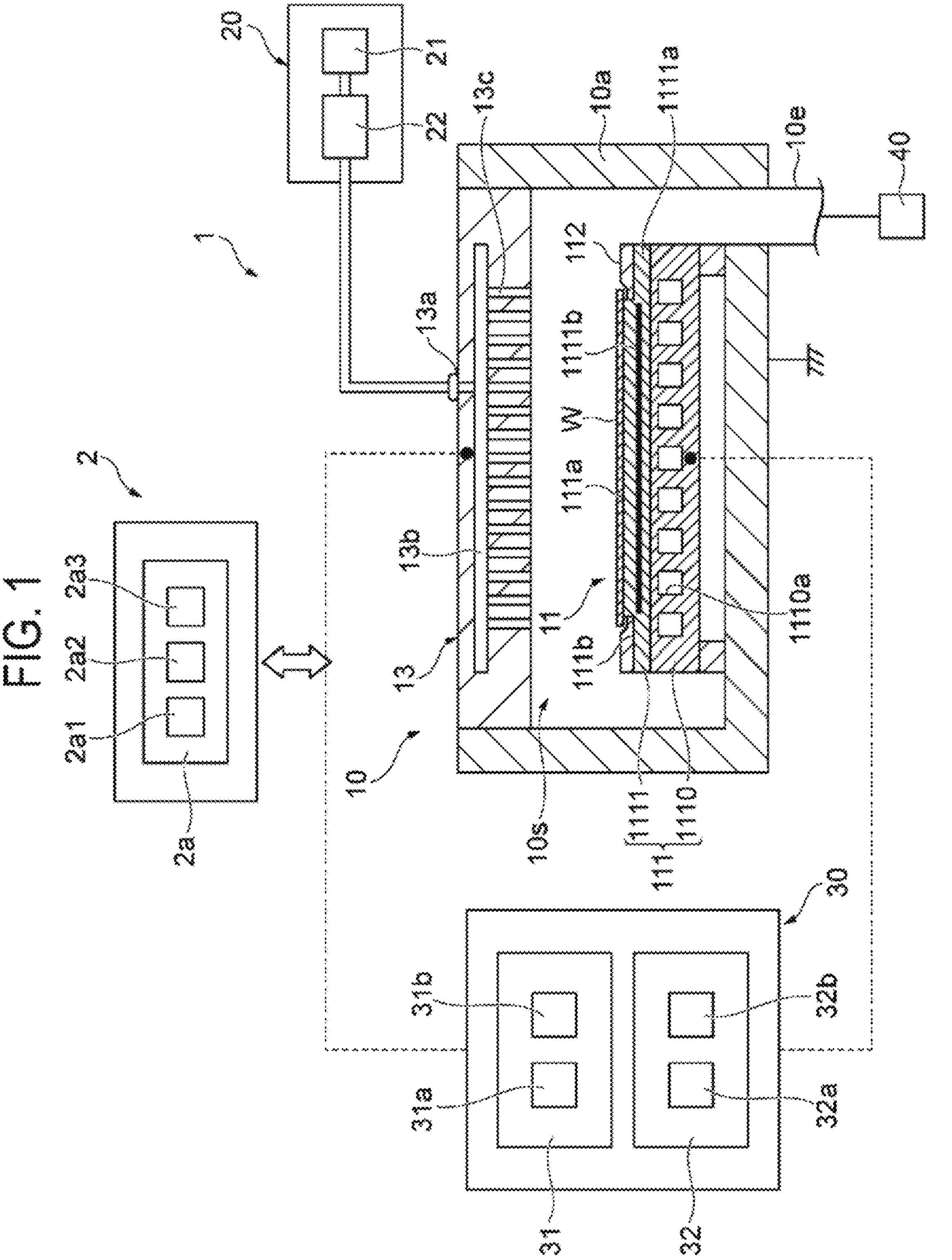
FIG. 1 is a view illustrating a configuration example of a capacitively coupled plasma processing apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Various exemplary embodiments are described below in detail with reference to the drawings. In addition, the same or equivalent parts are designated by like reference numerals in each drawing.

Hereinafter, a configuration example of a plasma processing system is described. FIG. 1 is a view illustrating a configuration example of a capacitively coupled plasma processing apparatus.

The plasma processing system includes a capacitively coupled plasma processing apparatus 1 and a controller 2. The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introducer. The gas introducer is configured to introduce at least one processing gas into the plasma processing chamber 10. The gas introducer includes a shower head 13. The substrate support 11 is located in the plasma processing chamber 10. The shower head 13 is located above the substrate support 11. In an embodiment, the shower head 13 constitutes at least a portion of a ceiling of the plasma processing chamber 10. The plasma processing chamber 10 has a plasma processing space 10*s* defined by the shower head 13, a sidewall 10*a* of the plasma processing chamber 10, and the substrate support 11. The plasma processing chamber 10 has at least one gas supply port for supplying at least one processing gas into the plasma processing space 10*s*, and at least one gas exhaust port for exhausting the gas from the plasma processing space 10*s*. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 111*a* for supporting a substrate W and an annular region 111*b* for supporting the ring assembly 112. A wafer is an example of the substrate W. The annular region 111*b* of the main body 111 surrounds the central region 111*a* of the main body 111 in plan view. The substrate W is located on the central region 111*a* of the main body 111 and the ring assembly 112 is located on the annular region 111*b* of the main body 111 to surround the substrate W on the central region 111*a* of the main body 111. Accordingly, the central region 111*a* is also referred to as a substrate support surface for supporting the substrate W, and the annular region 111*b* is also referred to as a ring support surface for supporting the ring assembly 112.

In an embodiment, the main body 111 includes a base 1110 and an electrostatic chuck 1111. The base 1110 includes a conductive member. The conductive member of the base 1110 may function as a lower electrode. The electrostatic chuck 1111 is located on the base 1110. The electrostatic chuck 1111 includes a ceramic member 1111*a* and an electrostatic electrode 1111*b* located in the ceramic member 1111*a*. The ceramic member 1111*a* includes the central region 111*a*. In an embodiment, the ceramic member 1111*a* also includes the annular region 111*b*. In addition, another member which surrounds the electrostatic chuck 1111, such as an annular electrostatic chuck or an annular insulating member, may include the annular region 111*b*. In this case, the ring assembly 112 may be located on the annular electrostatic chuck or the annular insulating member, or may be located on both the electrostatic chuck 1111 and the annular insulating member. Further, at least one RF/DC electrode coupled to a radio frequency (RF) power source 31 and/or a direct current (DC) power source 32, which will be described later, may be located in the ceramic member 1111*a*. In this case, the at least one RF/DC electrode functions as the lower electrode. When a bias RF signal and/or a DC signal, which will be described later, are supplied to the at least one RF/DC electrode, the RF/DC electrode is also referred to as a bias electrode. In addition, the conductive member of the base 1110 and the at least one RF/DC electrode may function as a plurality of lower electrodes. Further, the electrostatic electrode 1111*b* may function as the lower electrode. Accordingly, the substrate support 11 includes at least one lower electrode.

The ring assembly 112 includes one or more annular members. In an embodiment, one or more annular members include one or more edge rings and at least one cover ring. The edge ring is made of a conductive material or an insulating material, and the cover ring is made of an insulating material.

In addition, the substrate support 11 may include a temperature adjustment module configured to adjust at least one of the electrostatic chuck 1111, the ring assembly 112, and the substrate W to a target temperature. The temperature adjustment module may include a heater, a heat transfer medium, a flow path 1110*a*, or any combination thereof. A heat transfer fluid, such as brine or gas, flows through the flow path 1110*a*. In an embodiment, the flow path 1110*a* is formed inside the base 1110, and one or more heaters are arranged in the ceramic member 1111*a* of the electrostatic chuck 1111. Further, the substrate support 11 may include a heat transfer gas supply configured to supply a heat transfer gas to a gap between a rear surface of the substrate W and the central region 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes at least one upper electrode. In addition to the shower head 13, the gas introducer may include one or a plurality of side gas injectors (SGIs) installed in one or a plurality of openings formed in the sidewall 10*a*.

The gas supply 20 may include at least one gas source 21 and at least one flow rate controller 22. In an embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices which modulate or pulse flow rates of the at least one processing gas.

The power source 30 includes a RF power source 31 coupled to plasma processing chamber 10 via at least one impedance matching circuit. The RF power source 31 is configured to supply at least one RF signal (RF power) to the at least one lower electrode and/or the at least one upper electrode. Accordingly, plasma is formed from the at least one processing gas supplied into the plasma processing space 10*s*. Therefore, the RF power source 31 may function as at least a portion of a plasma generator configured to generate plasma from one or more processing gases in the plasma processing chamber 10. Further, by supplying the bias RF signal to the at least one lower electrode, a bias potential may be generated in the substrate W, and an ionic component in the formed plasma may be drawn into the substrate W.

In an embodiment, the RF power source 31 includes a first RF generator 31*a* and a second RF generator 31*b*. The first RF generator 31*a* is configured to be coupled to the at least one lower electrode and/or the at least one upper electrode via at least one impedance matching circuit, to generate a source RF signal (source RF power) for plasma generation. In an embodiment, the source RF signal has a frequency in a range of 10 MHz to 150 MHz. In an embodiment, the first RF generator 31*a* may be configured to generate a plurality of source RF signals having different frequencies. The generated one or more source RF signals are supplied to the at least one lower electrode and/or the at least one upper electrode.

The second RF generator 31*b* is configured to be coupled to the at least one lower electrode via at least one impedance matching circuit to generate the bias RF signal (bias RF power). A frequency of the bias RF signal may be equal to or different from that of the source RF signal. In an embodiment, the bias RF signal has a frequency lower than that of the source RF signal. In an embodiment, the bias RF signal has a frequency in a range of 100 kHz to 60 MHz. In an embodiment, the second RF generator 31*b* may be configured to generate a plurality of bias RF signals having different frequencies. The generated one or more bias RF signals are supplied to the at least one lower electrode. In addition, in various embodiments, at least one of the source RF signal and the bias RF signal may be pulsed.

In addition, the power source 30 may include a DC power source 32 coupled to the plasma processing chamber 10. The DC power source 32 includes a first DC generator 32*a* and a second DC generator 32*b*. In an embodiment, the first DC generator 32*a* is configured to be connected to the at least one lower electrode to generate a first DC signal. The generated first DC signal is applied to the at least one lower electrode. In an embodiment, the second DC generator 32*b* is configured to be connected to the at least one upper electrode to generate a second DC signal. The generated second DC signal is applied to the at least one upper electrode.

In various embodiments, at least one of the first and second DC signals may be pulsed. In this case, a sequence of voltage pulses is applied to the at least one lower electrode and/or the at least one upper electrode. The voltage pulse may have a pulse waveform of a rectangle, a trapezoid, a triangle or any combination thereof. In an embodiment, a waveform generator for generating a sequence of voltage pulses from the DC signal is connected between the first DC generator 32*a* and the at least one lower electrode. Accordingly, the first DC generator 32*a* and the waveform generator constitute a voltage pulse generator. When the second DC generator 32*b* and the waveform generator constitute a voltage pulse generator, the voltage pulse generator is connected to the at least one upper electrode. The voltage pulse may have a positive polarity or a negative polarity. In addition, the sequence of the voltage pulses may include one or more positive voltage pulses and one or more negative voltage pulses in one cycle. In addition, the first and second DC generators 32*a* and 32*b* may be provided in addition to the RF power source 31, and the first DC generator 32*a* may be provided instead of the second RF generator 31*b*.

The exhaust system 40 may be connected to, for example, a gas exhaust port 10*e* located at a bottom portion of the plasma processing chamber 10. The exhaust system 40 may include a pressure adjusting valve and a vacuum pump. By the pressure adjusting valve, a pressure in the plasma processing space 10*s* is adjusted. The vacuum pump may include a turbo molecular pump, a dry pump, or any combination thereof.

The controller 2 processes computer-executable instructions for instructing the plasma processing apparatus 1 to execute various processes described in the present disclosure. The controller 2 may be configured to control each component of the plasma processing apparatus 1 to execute the various processes described herein below. In an embodiment, a portion or the whole of the controller 2 may be included in the plasma processing apparatus 1. The controller 2 may include a processor 2*al*, a storage 2*a*2, and a communication interface 2*a*3. The controller 2 is implemented by, for example, a computer 2*a*. The processor 2*al* may be configured to read a program from the storage 2*a*2 and perform various control operations by executing the read program. The program may be stored in advance in the storage 2*a*2, or may be acquired via a medium when necessary. The acquired program is stored in the storage 2*a*2, and is read from the storage 2*a*2 and executed by the processor 2*al*. The medium may be various non-transitory storage medium readable by the computer 2*a*, or may be a communication line connected to the communication interface 2*a*3. The processor 2*al* may be a central processing unit (CPU). The storage 2*a*2 may include a random access memory (RAM), a read only memory (ROM), a hard disk drive (HDD), a solid state drive (SSD), or any combination thereof. The communication interface 2*a*3 may communicate with the plasma processing apparatus 1 via a communication line such as a local area network (LAN).

Figure 2:
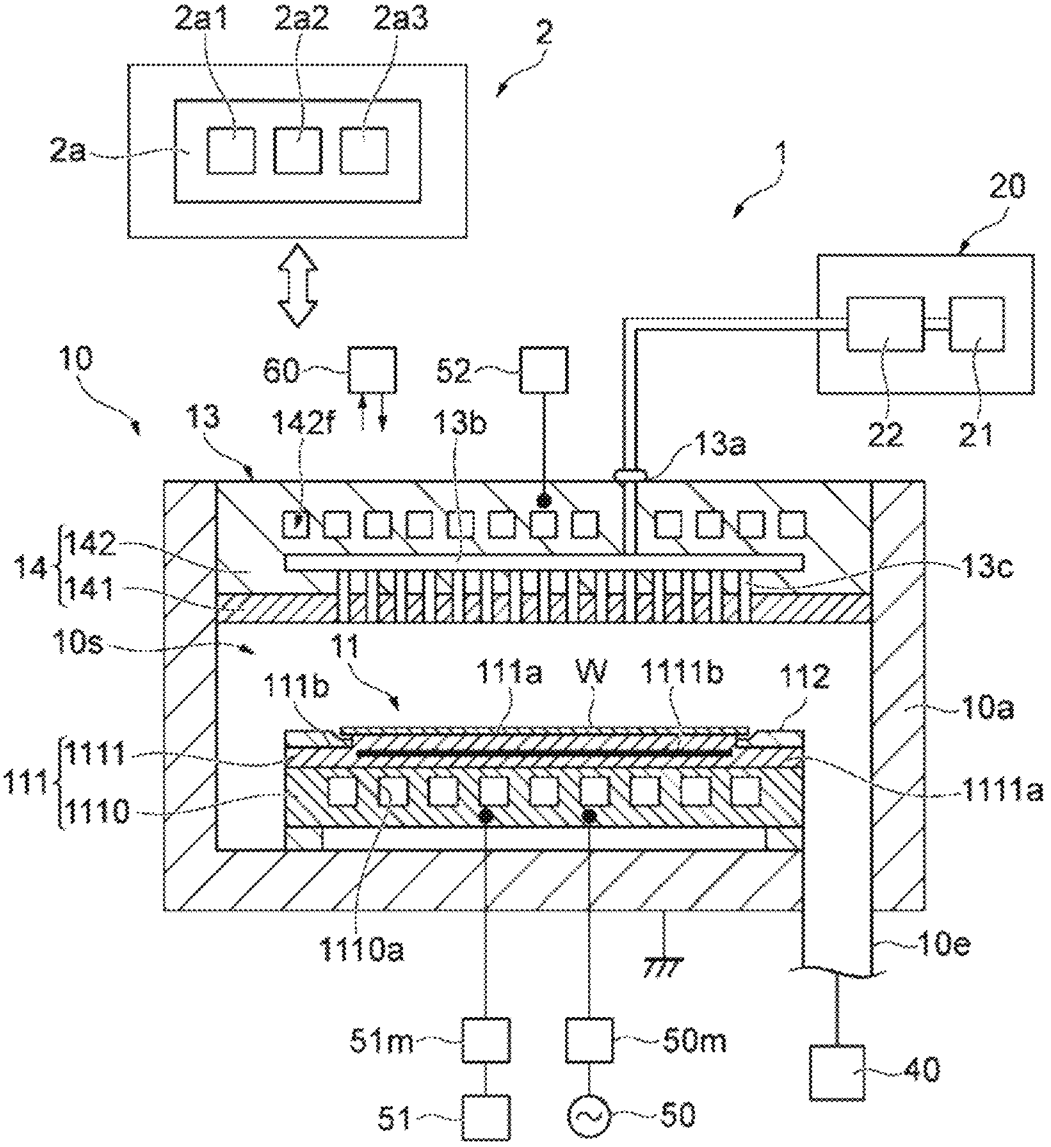
FIG. 2 is a view schematically illustrating a plasma processing apparatus according to an exemplary embodiment.

FIG. 2 is referred below. FIG. 2 is a view schematically illustrating a plasma processing apparatus according to an exemplary embodiment. As illustrated in FIG. 2, a plasma processing apparatus 1 includes an upper electrode 14 as the described-above upper electrode. In an embodiment, the upper electrode 14 includes a ceiling plate 141 and a cooling plate 142.

The ceiling plate 141 is in contact with the plasma processing space 10*s*, and defines the plasma processing space 10*s* from above the plasma processing space 10*s*. The ceiling plate 141 is made of a conductive material. The ceiling plate 141 is made of, for example, silicon. The cooling plate 142 is provided on the ceiling plate 141, and supports the ceiling plate 141. The cooling plate 142 is, for example, configured by forming a dielectric film such as aluminum oxide on a surface of a mother material made of aluminum. The cooling plate 142 includes a refrigerant flow path 142*f* formed inside the cooling plate 142. A refrigerant is supplied into the refrigerant flow path 142*f* from a chiller unit 60 provided outside a chamber 10. The refrigerant supplied into the refrigerant flow path 142*f* is returned to the chiller unit 60. The refrigerant is supplied into the refrigerant flow path 142*f*, so that the ceiling plate 141 is cooled.

The cooling plate 142 provides a gas diffusion chamber 13*b*. The ceiling plate 141 and the cooling plate 142 provides a plurality of gas holes which is the above-described plurality of gas introduction ports 13*c*. The plurality of gas holes extends through the cooling plate 142 and the ceiling plate 141 from the gas diffusion chamber 13*b*, and are opened toward the plasma processing space 10*s*.

The plasma processing apparatus 1 includes a radio-frequency power source 50, a first bias power source 51, and a second bias power source 52. The radio-frequency power source 50 is the above-described first RF generator 31*a*, and is electrically coupled to a radio-frequency electrode. The radio-frequency electrode is the above-described lower electrode of the substrate support 11 or the upper electrode 14. The radio-frequency power source 50 is configured to generate, as a source RF signal, a source radio-frequency power for generating plasma from a gas in the chamber 10. The radio-frequency power source 50 is electrically connected to the radio-frequency electrode via a matcher 50*m*. The matcher 50*m* includes a matching circuit for matching a load impedance of the radio-frequency power source 50 to an output impedance of the radio-frequency power source 50.

The first bias power source 51 is electrically coupled to the substrate support 11 (e.g., the above-described lower electrode). The first bias power source 51 is configured to generate an electric bias EB for drawing ions in plasma into the substrate W on the substrate support 11. The electric bias EB has a bias frequency. The bias frequency has a frequency in a range of 100 kHz or higher and 60 MHz or lower. The bias frequency is, for example, 400 KHz.

Figure 3A:
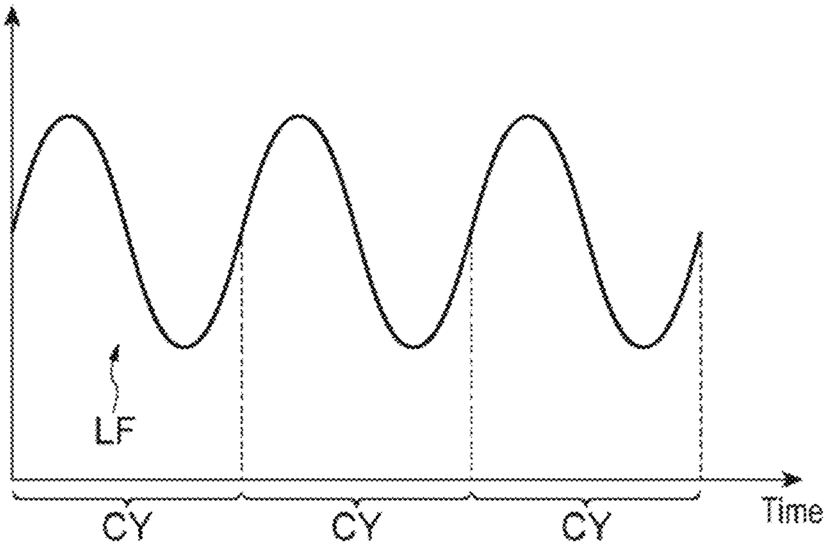
FIGS. 3A and 3B are views respectively illustrating a waveform example of an electric bias.

The first bias power source 51 may be the above-described second RF generator 31*b*. In this case, the first bias power source 51 is configured to generate, as the electric bias EB, a bias radio-frequency power LF which is the above-described bias RF signal. In this case, the first bias power source 51 is electrically connected to the substrate support 11 via a matcher 51*m*. The matcher 51*m* includes a matching circuit for matching a load impedance of the first bias power source 51 to an output impedance of the first bias power source 51. As illustrated in FIG. 3A, the bias radio-frequency power LF is a power having a waveform of a sine wave with a bias frequency, and is generated periodically. A waveform cycle CY of the bias radio-frequency power LF has a time period that is a reciprocal of the bias frequency.

Figure 3B:
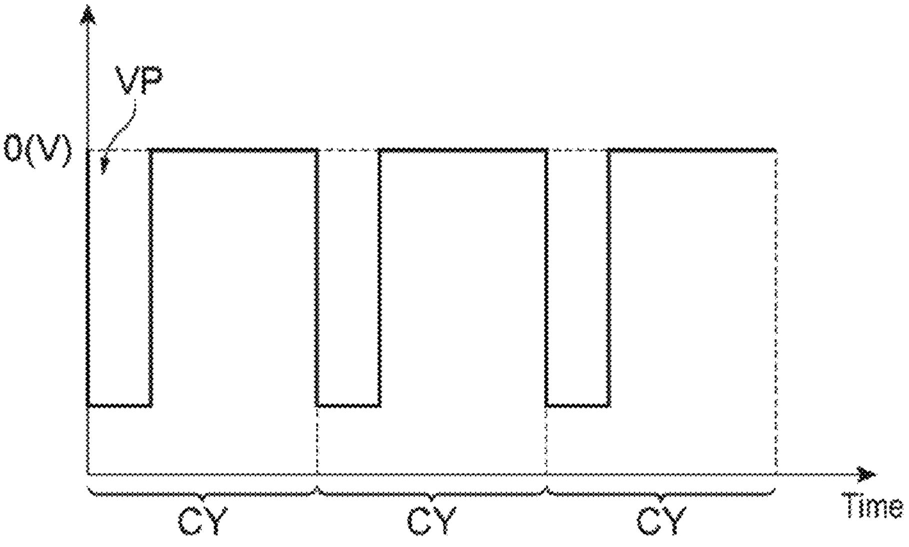

Alternatively, the first bias power source 51 may include the above-described first DC generator 32*a*. In this case, the first bias power source 51 is configured to periodically generate, as the electric bias EB, a voltage pulse VP which is the above-described first DC signal. In this case, since the plasma processing apparatus 1 may not include the matcher 51*m*, the first bias power source 51 is electrically connected to the substrate support 11 (e.g., the lower electrode) without passing through the matcher 51*m*. As illustrated in FIG. 3B, the voltage pulse VP is periodically generated at a time interval of a waveform cycle CY. Further, in the example of FIG. 3B, the voltage pulse VP is a pulse of a negative voltage or a negative direct current voltage. However, if ions from plasma are drawn into the substrate W, the polarity of the voltage pulse VP is not limited to a negative polarity.

The second bias power source 52 includes the above-described second DC generator 32*b*, and is electrically coupled to the upper electrode 14. The second bias power source 52 is configured to apply a negative voltage UEV to the upper electrode 14. The second bias power source 52 may include a variable direct current power source.

Figure 4:
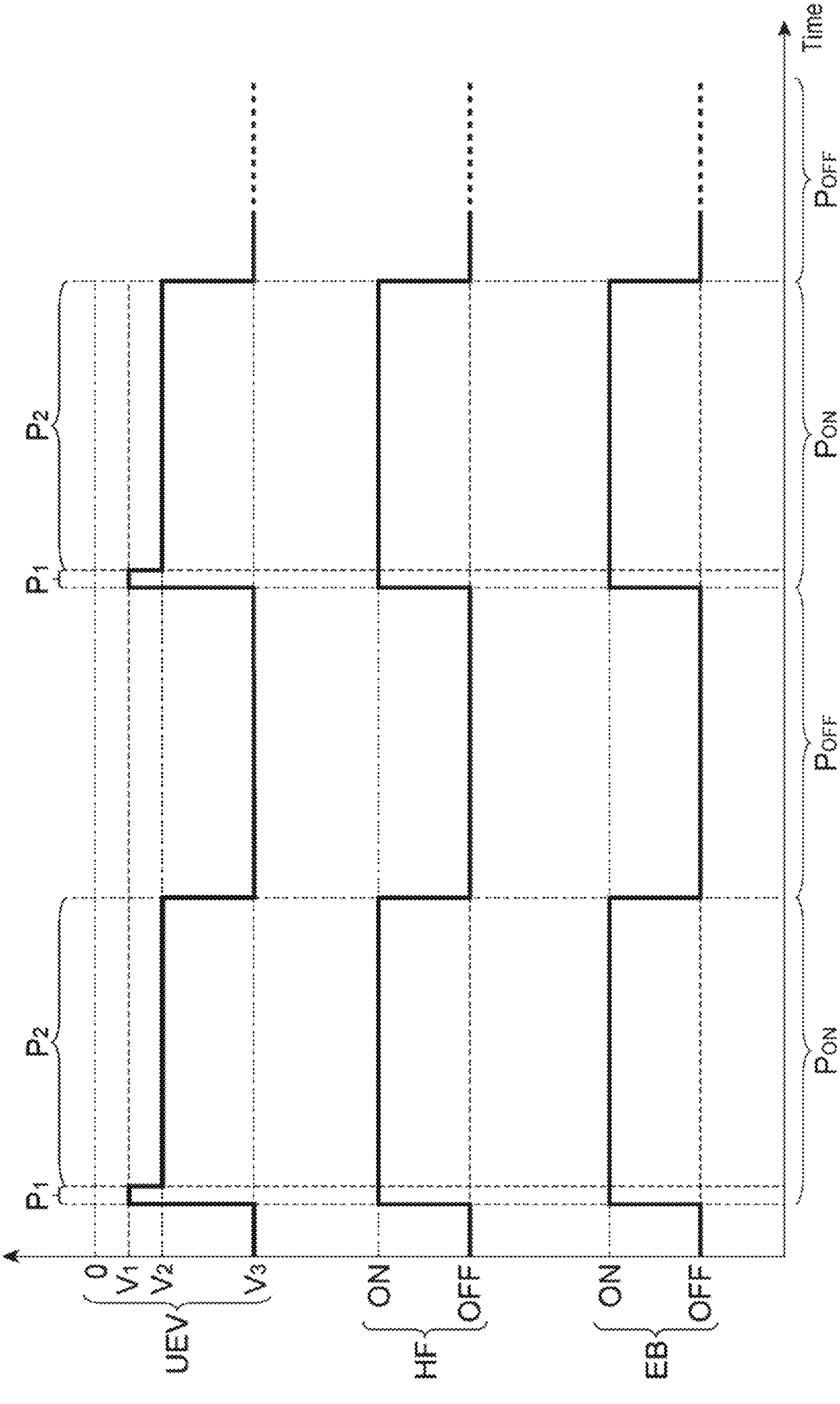
FIG. 4 is a timing chart related to the plasma processing apparatus according to the exemplary embodiment.

FIG. 4 is referred below together with FIGS. 2, 3A and 3B. FIG. 4 is a timing chart related to the plasma processing apparatus according to the exemplary embodiment. In an ON period $P_{ON}$, the controller 2 controls the radio-frequency power source 50 to supply a source radio-frequency power HF to the radio-frequency electrode. A power level of the source radio-frequency power HF in the ON period $P_{ON}$ is, for example, 1000 W or more.

Further, in the ON period $P_{ON}$, the controller 2 controls the first bias power source 51 to supply the electric bias EB to the substrate support 11 (e.g., the lower electrode). When the electric bias EB is the bias radio-frequency power LF, a power level of the bias radio-frequency power LF in the ON period $P_{ON}$ is, for example, 3000 W or more and 100000 W or less. When the electric bias EB includes the voltage pulse VP, a power level of the voltage pulse VP in the ON period $P_{ON}$ is, for example, a level in a range between −3000 V and −10000 V.

As illustrated in FIG. 4, the ON period $P_{ON}$ may include a first period $P_1$ and a second period $P_2$ after the first period $P_1$. In the first period $P_1$ including a start time point of the ON period $P_{ON}$, the controller 2 controls the second bias power source 52 to apply the negative voltage UEV of which a voltage level $V_1$ has a first absolute value $|V_1|$ to the upper electrode 14. The first absolute value $|V_1|$ is, for example, 0 V or more and 300 V or less. The first absolute value $|V_1|$ is, for example, 200 V. The first period $P_1$ may have a time period of four times or more of the waveform cycle CY. Also, the first period $P_1$ may have a time period of eight times or less or ten times or less of the waveform cycle CY. Further, the first period $P_1$ may start at the start time point of the ON period $P_{ON}$, and may start before the start time point of the ON period $P_{ON}$ or from a time point just before the ON period $P_{ON}$.

Further, in the second period $P_2$ after the first period $P_1$ in the ON period $P_{ON}$, the controller 2 controls the second bias power source 52 to apply the negative voltage UEV of which a voltage level $V_2$ has a second absolute value $|V_2|$ to the upper electrode 14. The first absolute value $|V_1|$ is smaller than the second absolute value $|V_2|$. The second absolute value $|V_2|$ is, for example, 100 V or more and 1000 V or less. The second absolute value $|V_2|$ is, for example, 500 V.

In an embodiment, the ON period $P_{ON}$ may appear alternately with an OFF period $P_{OFF}$. In the OFF period $P_{OFF}$, the controller 2 controls the radio-frequency power source 50 and the first bias power source 51 to stop the supply of the source radio-frequency power HF and the supply of the electric bias EB. That is, in an embodiment, the radio-frequency power source 50 is controlled by the controller 2 to periodically supply a pulse of the source radio-frequency power HF, and the first bias power source 51 is controlled by the controller 2 to periodically supply a pulse of the electric bias EB. The pulse of the source radio-frequency power HF and the pulse of the electric bias EB are periodically supplied, for example, at a pulse frequency of 1 kHz or higher and 20 kHz or lower. That is, the ON period $P_{ON}$ periodically appears at a time interval of a reciprocal of the pulse frequency.

In the OFF period $P_{OFF}$, the controller 2 may control the second bias power source 52 to apply the negative voltage UEV to the upper electrode 14. A third absolute value $|V_3|$ of a voltage level $V_3$ of the negative voltage UEV in the OFF period $P_{OFF}$ may be larger than the second absolute value $|V_2|$. The third absolute value $|V_3|$ is, for example, 300 V or more and 1000 V or less. The third absolute value $|V_3|$ is, for example, 1000 V.

In the plasma processing apparatus 1, the negative voltage UEV is applied to the upper electrode 14 in the ON period $P_{ON}$. Accordingly, a distance between plasma and the upper electrode 14 is increased, so that an increase in temperature of the upper electrode 14 is suppressed.

In addition, the first absolute value $|V_1|$ of the voltage level of the negative voltage UEV in the first period $P_1$ is smaller than the second absolute value $|V_2|$ of the voltage level of the negative voltage UEV in the second period $P_2$. Therefore, abnormal discharge in the plurality of gas holes of the upper electrode 14 just after the start of the ON period $P_{ON}$, which may occur when the voltage level of the negative voltage UEV in the second period $P_2$ is not small, is suppressed.

In addition, since the negative voltage UEV is applied to the upper electrode 14 even in the OFF period $P_{OFF}$, charge removal of the upper electrode 14 in the OFF period $P_{OFF}$ is performed.

Figure 5:
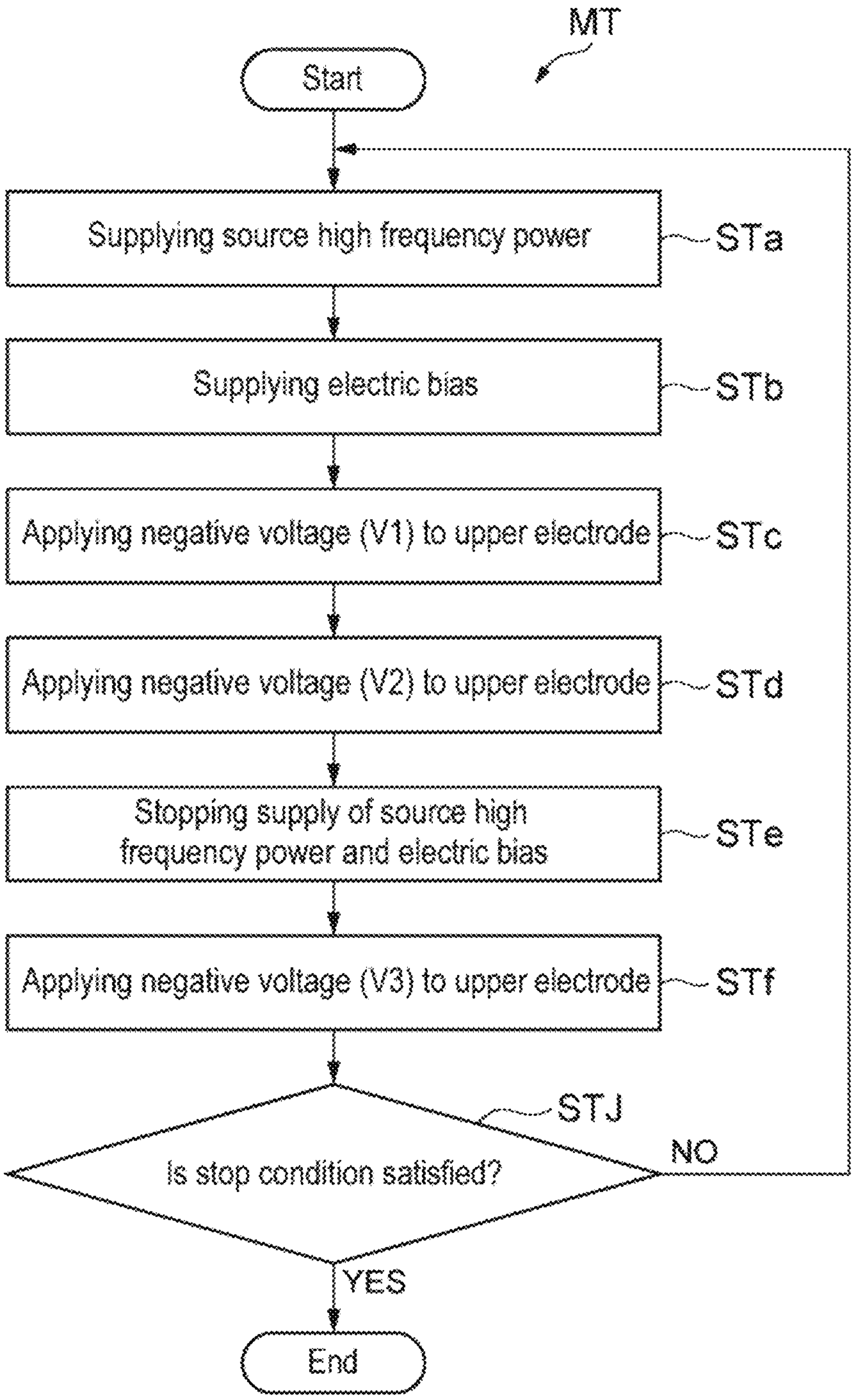
FIG. 5 is a flowchart of a control method of the plasma processing apparatus according to the exemplary embodiment.

A control method of the plasma processing apparatus according to the exemplary embodiment is described below with reference to FIG. 5. FIG. 5 is a flowchart of a control method of the plasma processing apparatus according to the exemplary embodiment. The control method (hereinafter, referred to as a "method MT") shown in FIG. 5 includes processes STa to STd.

Process STa is performed throughout the ON period $P_{ON}$. In the process STa, in order to generate plasma from a gas in the chamber 10 of the plasma processing apparatus 1, the source radio-frequency power HF is supplied to the radio-frequency electrode from the radio-frequency power source 50.

Process STb is performed throughout the ON period $P_{ON}$. In the process STb, in order to draw ions in the chamber 10 into the substrate W on the substrate support 11, the electric bias EB is supplied to the substrate support 11 (e.g., the lower electrode) from the first bias power source 51.

Process STc is performed in the above-described first period $P_1$. In the process STc, the negative voltage UEV of the voltage level $V_1$ has the first absolute value $|V_1|$ is applied to the upper electrode 14 from the second bias power source 52.

Process STd is performed in the above-described second period $P_2$. In the process STd, the negative voltage UEV of the voltage level $V_2$ has the second absolute value $|V_2|$ is applied to the upper electrode 14 from the second bias power source 52. As described above, the first absolute value $|V_1|$ is smaller than the second absolute value $|V_2|$.

In the method MT, the ON period $P_{ON}$ and the OFF period $P_{OFF}$ may also be alternately repeated. In this case, the method MT further includes process STe, process STf, and process STJ.

The processes STe and STf are performed throughout the OFF period $P_{OFF}$. In the process STe, the supply of the source radio-frequency power HF and the electric bias EB is stopped. In the process STf, the negative voltage UEV is applied to the upper electrode 14 from the second bias power source 52. The third absolute value $|V_3|$ of the voltage level $V_3$ of the negative voltage UEV in the process STf may be larger than the second absolute value $|V_2|$ as described above.

In the process STJ, it is determined whether a stop condition is satisfied. The stop condition is satisfied, for example, when a repetition number of the processes Sta to STf reaches a predetermined number. In the process STJ, if it is determined that the stop condition is not satisfied, the processes from the process STa are repeated again. In the process STJ, it is determined that the stop condition is satisfied, the method MT ends.

Figure 6:
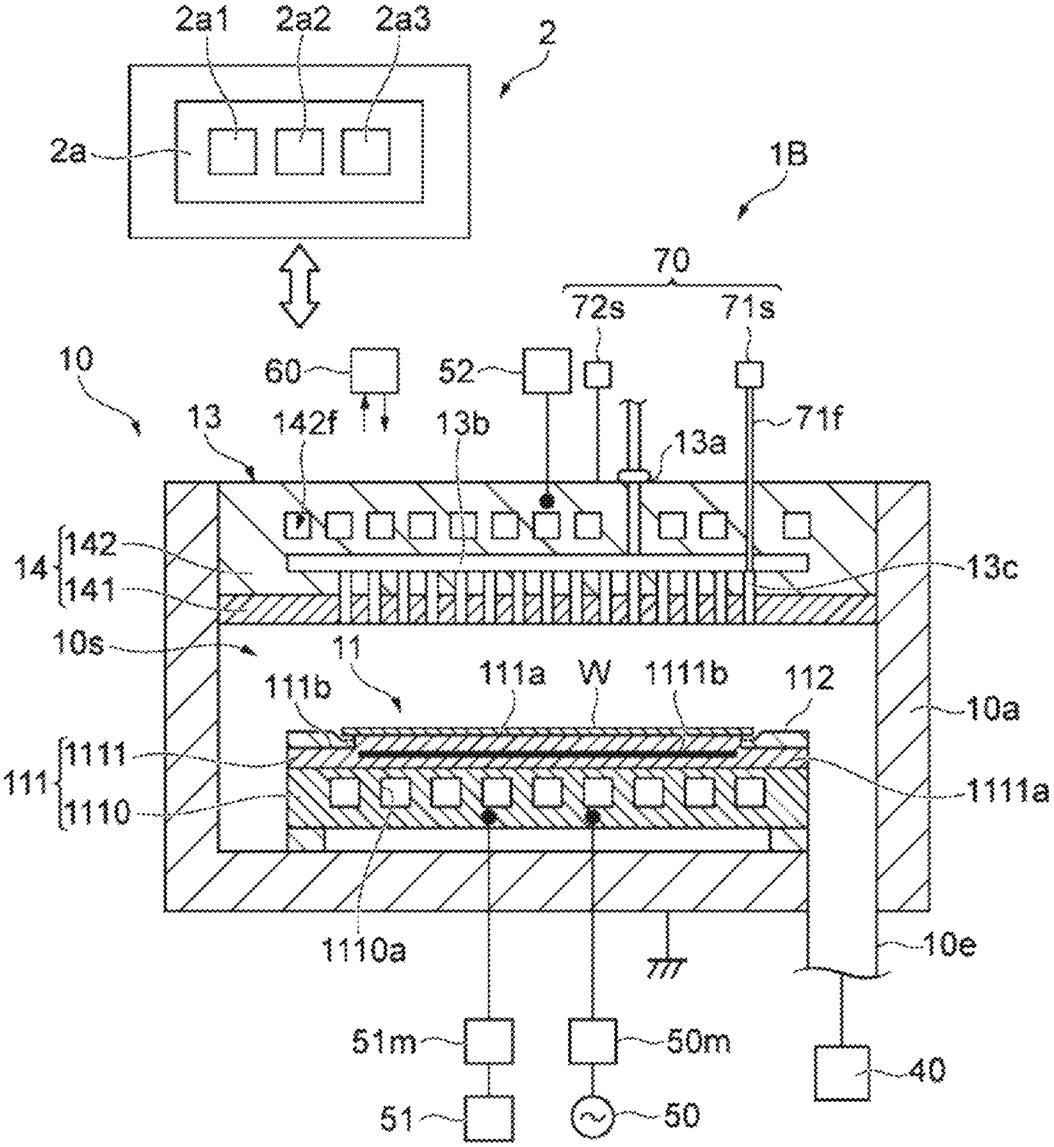
FIG. 6 is a view schematically illustrating a plasma processing apparatus according to another exemplary embodiment.

A plasma processing apparatus according to another exemplary embodiment is described below with reference to FIG. 6. FIG. 6 is a view schematically illustrating a plasma processing apparatus according to another exemplary embodiment. Hereinafter, a plasma processing apparatus 1B shown in FIG. 6 is described from the viewpoint of differences from the plasma processing apparatus 1.

The plasma processing apparatus 1B further includes a detector 70. The detector 70 is configured to acquire a detection signal changed from a magnitude in normality of the upper electrode 14 when a possibility of discharge in the upper electrode 14 exists. A detection period of the detection signal may include the whole or a portion of the ON period $P_{ON}$. The portion of the ON period $P_{ON}$, which is the detection period of the detection signal, may include the start time point of the ON period $P_{ON}$. The detection period of the detection signal may further include at least a portion of the OFF period $P_{OFF}$. The detection signal is input to the controller 2.

The detection signal may be a signal representing a light emission intensity in a gas hole for monitoring among the plurality of gas holes (i.e., the plurality of gas introduction ports 13*c*) of the upper electrode 14. In this case, the detector 70 includes an optical sensor 71*s* configured to measure the light emission intensity in the gas hole for monitoring (hereinafter, referred to as a "light emission intensity"). An optical fiber extends between the optical sensor 71*s* and the gas hole for monitoring to optically connect the optical sensor 71*s* and the gas hole for monitoring.

Alternatively, the detection signal may be a signal representing a potential or current value of the upper electrode 14. In this case, the detector 70 includes an electrical sensor 72*s* configured to measure the potential or current value of the upper electrode 14. The electrical sensor 72*s* is electrically connected to the upper electrode 14.

In the plasma processing apparatus 1B, the controller 2 performs a first control if it is determined from the detection signal that the possibility of discharge in the upper electrode 14 does not exist, and performs a second control if it is determined from the detection signal that a possibility of discharge in the upper electrode 14 exists.

If the light emission intensity in the gas hole for monitoring, the potential of the upper electrode 14, or the current value of the upper electrode 14 is at a threshold or greater than the threshold, or exceeds the threshold, the controller 2 determines that the possibility of discharge in the upper electrode 14 exists and may perform the second control. If not, the controller 2 performs the first control.

Alternatively, if a difference value between one of the light emission intensity in the gas hole for monitoring, the potential of the upper electrode 14, or the current value of the upper electrode 14 and a corresponding value in the normality is at a threshold or greater than the threshold, or exceeds the threshold, the controller 2 determines that the possibility of discharge in the upper electrode 14 exists and may perform the second control. If not, the controller 2 performs the first control.

Figure 7:
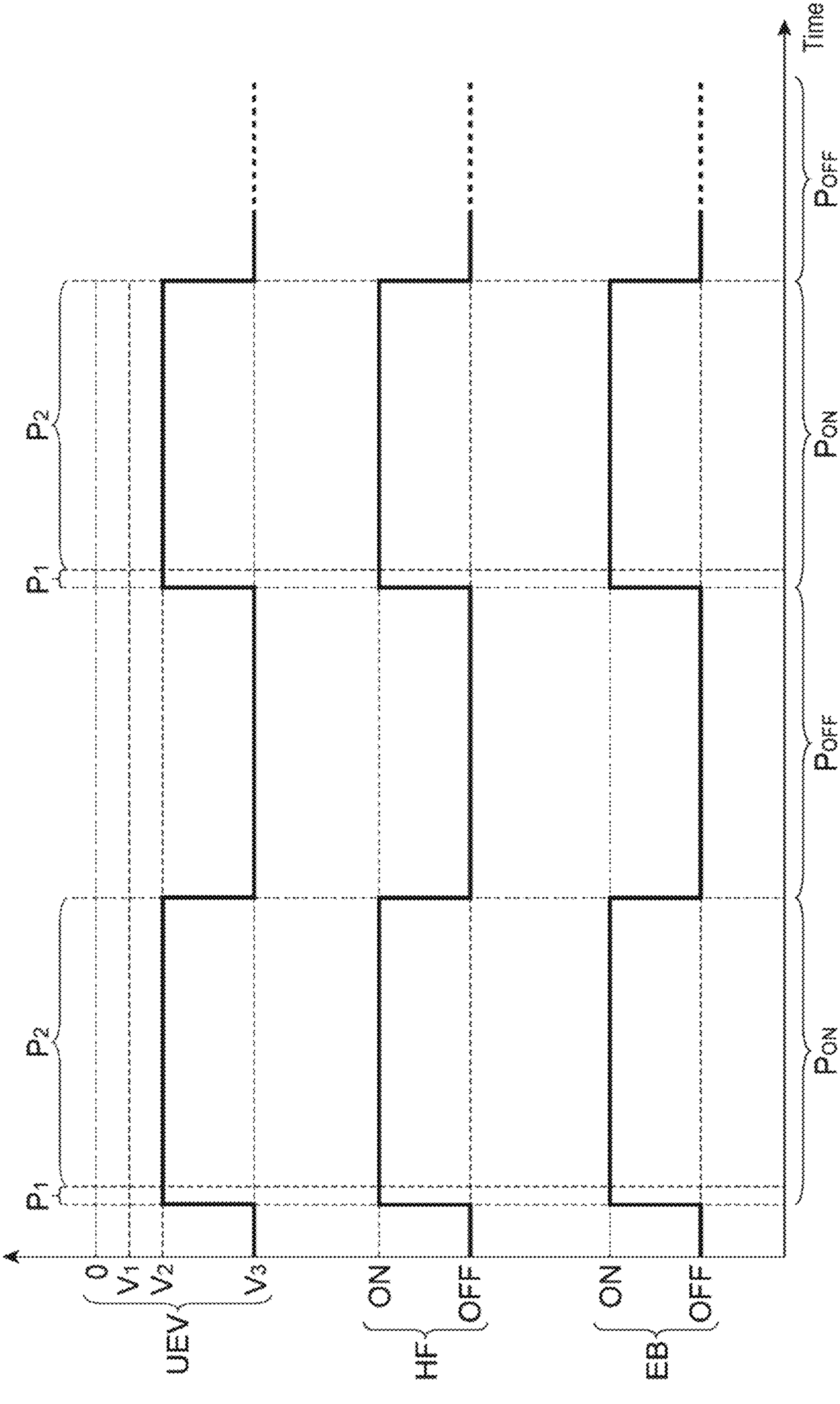
FIG. 7 is a timing chart related to the plasma processing apparatus according to the another exemplary embodiment.

The first control performed by the controller 2 includes controlling the second bias power source 52 to apply, to the upper electrode 14, the negative voltage UEV of which the voltage level $V_2$ has the above-described second absolute value $|V_2|$ throughout the ON period $P_{ON}$ as illustrated in FIG. 7.

The second control performed by the controller 2 includes controlling the second bias power source 52 to apply, to the upper electrode 14, the negative voltage UEV of which the voltage level $V_1$ has the above-described first absolute value $|V_1|$ in the first period $P_1$ as illustrated in FIG. 4. Also, the second control performed by the controller 2 includes controlling the second bias power source 52 to apply, to the upper electrode 14, the negative voltage UEV of which the voltage level $V_2$ has the above-described second absolute value $|V_2|$ in the second period $P_2$ as illustrated in FIG. 4.

According to the plasma processing apparatus 1B, it is possible to control the voltage applied to the upper electrode 14 through the first control without performing the unnecessary second control when the possibility of discharge in the upper electrode 14 does not exist.

Figure 8:
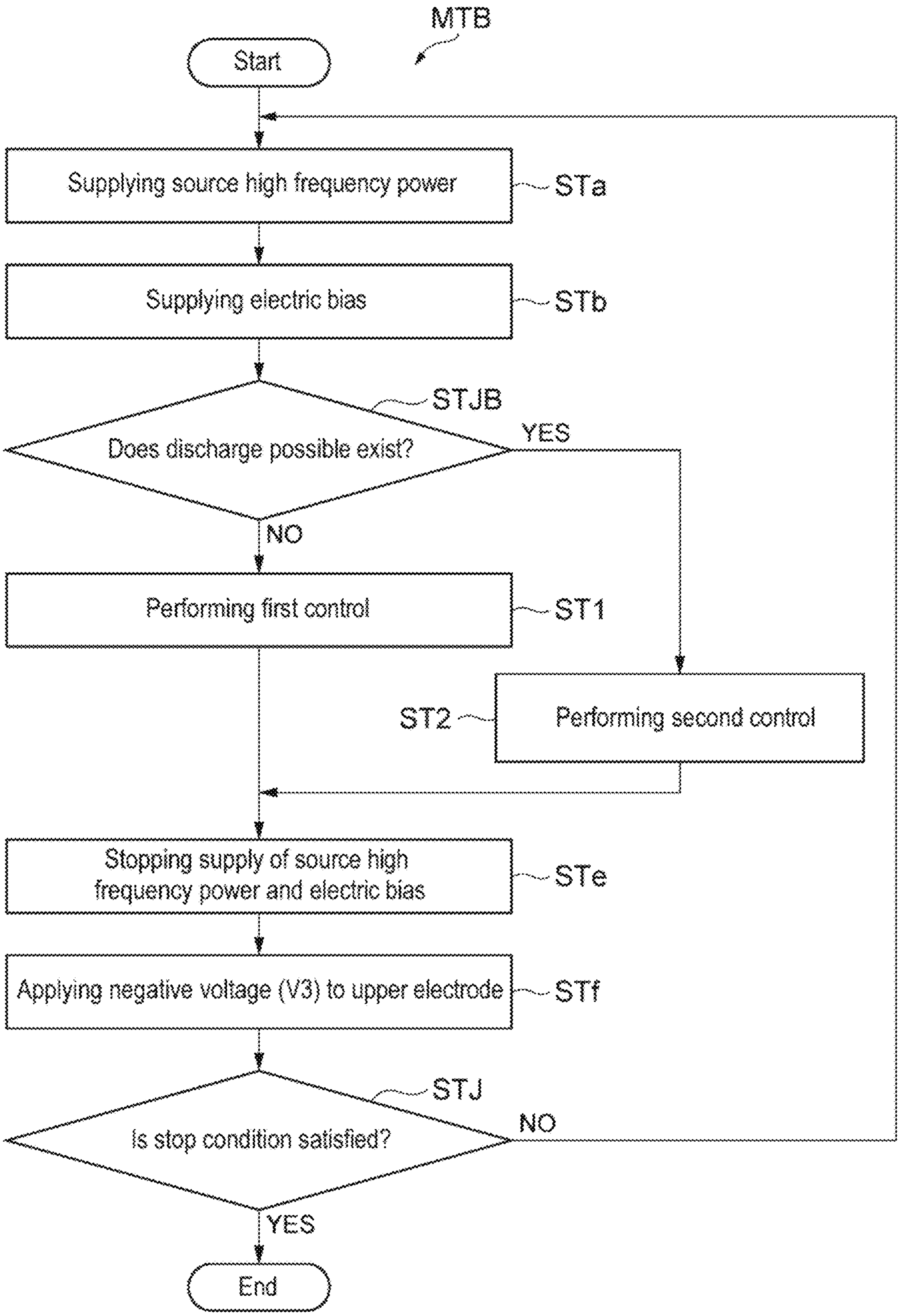
FIG. 8 is a flowchart of a control method of the plasma processing apparatus according to the another exemplary embodiment.

A control method of the plasma processing apparatus according to the another exemplary embodiment is described below with reference to FIG. 8. FIG. 8 is a flowchart of a control method of the plasma processing apparatus according to the another exemplary embodiment. Hereinafter, a control method (hereinafter, referred to as a "method MTB") shown in FIG. 8 is described from the viewpoint of differences from the method MT.

The method MTB further includes process STJB. In the process STJB, the controller 2 determines whether the possibility of discharge in the upper electrode 14 exists from the detection signal acquired by the detector 70. As for the determination of the possibility of discharge in the upper electrode 14, refer to the aforementioned description of the plasma processing apparatus 1B.

In the process STJB, when it is determined that the possibility of discharge in the upper electrode 14 does not exist, the above-described first control is performed in process ST1. After the process ST1, a processing may be transferred to the process STe.

In the process STJB, when it is determined that the possibility of discharge in the upper electrode 14 exists, the above-described second control is performed process ST2. The second control includes the processes STc and STd of the method MT. After the process ST2, a processing may be transferred to the process STe.

In the above, various exemplary embodiments have been described above, but the present disclosure is not limited to the aforementioned exemplary embodiments, and various additions, omissions, substitutions, and changes may be made. The components in the different embodiments may be combined to form another embodiment.

Hereinafter, various exemplary embodiments included in the present disclosure are described in the following [E1] to [E18].

[E1] A plasma processing apparatus including:
- a chamber;
- a substrate support disposed in the chamber;
- an upper electrode disposed above the substrate support, wherein a plurality of gas holes for introducing a gas into the chamber is formed in the upper electrode;
- a radio-frequency power source configured to be electrically coupled to a radio-frequency electrode which is the substrate support or the upper electrode, and generate a source radio-frequency power for generating plasma from the gas in the chamber;
- a first bias power source configured to be electrically coupled to the substrate support, and generate an electric bias for drawing ions in the chamber into a substrate on the substrate support;
- a second bias power source configured to apply a negative voltage to the upper electrode; and
- a controller,
- wherein the controller is configured to:
  - control the radio-frequency power source to supply the source radio-frequency power to the radio-frequency electrode in an ON period;
  - control the first bias power source to supply the electric bias to the substrate support in the ON period;
  - control the second bias power source to apply a first negative voltage of which a voltage level has a first absolute value to the upper electrode in a first period including a start time point of the ON period; and
  - control the second bias power source to apply a second negative voltage of which a voltage level has a second absolute value to the upper electrode in a second period after the first period in the ON period, and wherein the first absolute value is smaller than the second absolute value.

[E2] The plasma processing apparatus described in E1, wherein the electric bias is a bias radio-frequency power having a bias frequency or a voltage pulse periodically generated at a time interval that is a reciprocal of the bias frequency, and
- wherein the first period has a length of four times or more of a cycle having a time period that is the reciprocal of the bias frequency from the start time point.

[E3] The plasma processing apparatus described in E2, wherein the first period has a length of eight times or less or ten times or less of the cycle.

[E4] The plasma processing apparatus described in any one of E1 to E3, wherein the ON period and an OFF period are alternately performed, and
- wherein the controller is further configured to control the radio-frequency power source and the first bias power source to stop the supply of the source radio-frequency power and the supply of the electric bias in the OFF period.

[E5] The plasma processing apparatus described in E4, wherein the controller is further configured to control the second bias power source to apply a third negative voltage of a voltage level has a third absolute value larger than the second absolute value to the upper electrode in the OFF period.

[E6] The plasma processing apparatus described in any one of E1 to E5, wherein the upper electrode includes:
- a ceiling plate in contact with a plasma processing space in the chamber; and
- a cooling plate including a refrigerant flow path in the cooling plate, and installed on the ceiling plate.

[E7] The plasma processing apparatus described in E6, wherein the ceiling plate is made of silicon.

[E8] A control method including:
- supplying a source radio-frequency power from a radio-frequency power source to a radio-frequency electrode, which is a substrate support in a chamber of a plasma processing apparatus or an upper electrode disposed above the substrate support, to generate plasma from a gas in the chamber in an ON period;
- supplying an electric bias to the substrate support from a first bias power source to the substrate support to draw ions in the chamber into a substrate on the substrate support in the ON period;
- applying a first negative voltage of which a voltage level has a first absolute value from a second bias power source to the upper electrode in a first period including a start time point of the ON period; and
- applying a second negative voltage of which a voltage level has a second absolute value from the second bias power source to the upper electrode in a second period after the first period in the ON period,
- wherein the first absolute value is smaller than the second absolute value.

[E9] A plasma processing apparatus including:
- a chamber;
- a substrate support disposed in the chamber;
- an upper electrode disposed above the substrate support, wherein a plurality of gas holes for introducing a gas into the chamber is formed in the upper electrode;
- a radio-frequency power source electrically configured to be electrically coupled to a radio-frequency electrode which is the substrate support or the upper electrode, and generate a source radio-frequency power for generating plasma from the gas in the chamber;
- a first bias power source configured to be electrically coupled to the substrate support, and generate an electric bias for drawing ions in the chamber into a substrate on the substrate support;
- a second bias power source configured to apply a negative voltage to the upper electrode;
- a detector configured to acquire a detection signal which is a signal representing a light emission intensity in a gas hole for monitoring among the plurality of gas holes or a signal representing a potential or a current value of the upper electrode; and
- a controller,
- wherein the controller is configured to:
  - control the radio-frequency power source to supply the source radio-frequency power to the radio-frequency electrode in an ON period;
  - control the first bias power source to supply the electric bias to the substrate support in the ON period;
  - perform a first control if it is determined from the detection signal that a possibility of discharge in the upper electrode does not exist; and perform a second control if it is determined from the detection signal that the possibility of discharge in the upper electrode exists, wherein the second control includes:

controlling the second bias power source to apply a first negative voltage of which a voltage level has a first absolute value to the upper electrode in a first period including a start time point of the ON period; and controlling the second bias power source to apply a second negative voltage of which a voltage level has a second absolute value to the upper electrode in a second period after the first period in the ON period, wherein the first control includes controlling the second bias power source to apply the second negative voltage to the upper electrode throughout the ON period, and wherein the first absolute value is smaller than the second absolute value.

[E10] The plasma processing apparatus described in E9, wherein the electric bias is a bias radio-frequency power having a bias frequency or a voltage pulse periodically generated at a time interval that is a reciprocal of the bias frequency, and wherein the first period has a length of four times or more of a cycle having a time period that is the reciprocal of the bias frequency from the start time point.

[E11] The plasma processing apparatus described in E10, wherein the first period has a length of eight times or less or ten times or less of the cycle.

[E12] The plasma processing apparatus described in any one of E9 to E11, wherein the ON period and an OFF period are alternately performed, and wherein the controller is further configured to control the radio-frequency power source and the first bias power source to stop the supply of the source radio-frequency power and the supply of the electric bias in the OFF period.

[E13] The plasma processing apparatus described in E12, wherein the controller is further configured to control the second bias power source to apply a third negative voltage of a voltage level has a third absolute value larger than the second absolute value to the upper electrode in the OFF period.

[E14] The plasma processing apparatus described in any one of E9 to E13, wherein the upper electrode includes:

a ceiling plate in contact with a plasma processing space in the chamber; and a cooling plate including a refrigerant flow path in the cooling plate, and installed on the ceiling plate.

[E15] The plasma processing apparatus described in E14, wherein the ceiling plate is made of silicon.

[E16] The plasma processing apparatus described in any one of E9 to E15, wherein the controller is further configured to perform the second control when at least one of the light emission intensity, the potential, or the current value, which is specified from the detection signal, is at a threshold or greater than the threshold, or exceeds the threshold.

[E17] The plasma processing apparatus described in any one of E9 to E15, wherein the controller is further configured to perform the second control if at least one of a first difference value between the light emission intensity specified from the detection signal and a normal value of the light emission intensity, a second difference value between the potential specified from the detection signal and a normal value of the potential, or a third difference value of the current value specified from the detection signal and a normal value of the current value is at a threshold or greater than the threshold, or exceeds the threshold.

[E18] A control method including:

supplying a source radio-frequency power from a radio-frequency power source to a radio-frequency electrode, which is a substrate support in a chamber of a plasma processing apparatus or an upper electrode disposed above the substrate support, to generate plasma from a gas in the chamber in an ON period;

supplying an electric bias to the substrate support from a first bias power source to the substrate support to draw ions in the chamber into a substrate on the substrate support in the ON period;

performing a first control if it is determined that a possibility of discharge in the upper electrode does not exist from a signal representing a light emission intensity in a gas hole for monitoring among a plurality of gas holes of the upper electrode, through which the gas is introduced into the chamber, or a detection signal which is a signal representing a potential or current value of the upper electrode; and performing a second control if it is determined from the detection signal that the possibility of discharge in the upper electrode exists, wherein the second control includes:

applying a first negative voltage of which a voltage level has a first absolute value from a second bias power source to the upper electrode in a first period including a start time point of the ON period; and applying a second negative voltage of which a voltage level has a second absolute value from the second bias power source to the upper electrode in a second period after the first period in the ON period, wherein the first control includes applying the second negative voltage from the second bias power source to the upper electrode throughout the ON period, and wherein the first absolute value is smaller than the second absolute value.

According to the present disclosure in some embodiments, it is possible to provide a technique of suppressing discharge in the upper electrode of the plasma processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:

a chamber;

a substrate support disposed in the chamber;

an upper electrode disposed above the substrate support, wherein a plurality of gas holes for introducing a gas into the chamber is formed in the upper electrode;

a radio-frequency power source configured to be electrically coupled to a radio-frequency electrode which is the substrate support or the upper electrode, and generate a source radio-frequency power for generating plasma from the gas in the chamber;

a first bias power source configured to be electrically coupled to the substrate support, and generate an electric bias for drawing ions in the chamber into a substrate on the substrate support;

a second bias power source configured to apply a negative voltage to the upper electrode; and a controller, wherein the controller is configured to:

control the radio-frequency power source to supply the source radio-frequency power to the radio-frequency electrode in an ON period;

control the first bias power source to supply the electric bias to the substrate support in the ON period;

control the second bias power source to apply a first negative voltage of which a voltage level has a first absolute value to the upper electrode in a first period including a start time point of the ON period; and control the second bias power source to apply a second negative voltage of which a voltage level has a second absolute value to the upper electrode in a second period after the first period in the ON period, and wherein the first absolute value is smaller than the second absolute value.

2. The plasma processing apparatus of claim 1, wherein the electric bias is a bias radio-frequency power having a bias frequency or a voltage pulse periodically generated at a time interval that is a reciprocal of the bias frequency, and wherein the first period has a length of four times or more of a cycle having a time period that is the reciprocal of the bias frequency from the start time point.

3. The plasma processing apparatus of claim 2, wherein the first period has a length of either less than or equal to eight times the cycle or less than or equal to ten times the cycle.

4. The plasma processing apparatus of claim 3, wherein the ON period and an OFF period are alternately performed, and wherein the controller is further configured to control the radio-frequency power source and the first bias power source to stop the supply of the source radio-frequency power and the supply of the electric bias in the OFF period.

5. The plasma processing apparatus of claim 4, wherein the controller is further configured to control the second bias power source to apply a third negative voltage of a voltage level has a third absolute value larger than the second absolute value to the upper electrode in the OFF period.

6. The plasma processing apparatus of claim 3, wherein the upper electrode includes:

a ceiling plate in contact with a plasma processing space in the chamber; and a cooling plate including a refrigerant flow path in the cooling plate, and installed on the ceiling plate.

7. The plasma processing apparatus of claim 6, wherein the ceiling plate is made of silicon.

8. A control method comprising:

supplying a source radio-frequency power from a radio-frequency power source to a radio-frequency electrode, which is a substrate support in a chamber of a plasma processing apparatus or an upper electrode disposed above the substrate support, to generate plasma from a gas in the chamber in an ON period;

supplying an electric bias to the substrate support from a first bias power source to the substrate support to draw ions in the chamber into a substrate on the substrate support in the ON period;

applying a first negative voltage of which a voltage level has a first absolute value from a second bias power source to the upper electrode in a first period including a start time point of the ON period; and applying a second negative voltage of which a voltage level has a second absolute value from the second bias power source to the upper electrode in a second period after the first period in the ON period, wherein the first absolute value is smaller than the second absolute value.

9. A plasma processing apparatus comprising:

a chamber;

a substrate support disposed in the chamber;

an upper electrode disposed above the substrate support, wherein a plurality of gas holes for introducing a gas into the chamber is formed in the upper electrode;

a radio-frequency power source electrically configured to be electrically coupled to a radio-frequency electrode which is the substrate support or the upper electrode, and generate a source radio-frequency power for generating plasma from the gas in the chamber;

a first bias power source configured to be electrically coupled to the substrate support, and generate an electric bias for drawing ions in the chamber into a substrate on the substrate support;

a second bias power source configured to apply a negative voltage to the upper electrode;

a detector configured to acquire a detection signal which is a signal representing a light emission intensity in a gas hole for monitoring among the plurality of gas holes or a signal representing a potential or a current value of the upper electrode; and a controller, wherein the controller is configured to:

control the radio-frequency power source to supply the source radio-frequency power to the radio-frequency electrode in an ON period;

control the first bias power source to supply the electric bias to the substrate support in the ON period;

perform a first control if it is determined from the detection signal that a possibility of discharge in the upper electrode does not exist; and perform a second control if it is determined from the detection signal that the possibility of discharge in the upper electrode exists, wherein the second control includes:

controlling the second bias power source to apply a first negative voltage of which a voltage level has a first absolute value to the upper electrode in a first period including a start time point of the ON period; and controlling the second bias power source to apply a second negative voltage of which a voltage level has a second absolute value to the upper electrode in a second period after the first period in the ON period, wherein the first control includes controlling the second bias power source to apply the second negative voltage to the upper electrode throughout the ON period, and wherein the first absolute value is smaller than the second absolute value.

10. The plasma processing apparatus of claim 9, wherein the electric bias is a bias radio-frequency power having a bias frequency or a voltage pulse periodically generated at a time interval that is a reciprocal of the bias frequency, and wherein the first period has a length of four times or more of a cycle having a time period that is the reciprocal of the bias frequency from the start time point.

11. The plasma processing apparatus of claim 10, wherein the first period has a length of either less than or equal to eight times the cycle or less than or equal to ten times the cycle.

12. The plasma processing apparatus of claim 11, wherein the ON period and an OFF period are alternately performed, and wherein the controller is further configured to control the radio-frequency power source and the first bias power source to stop the supply of the source radio-frequency power and the supply of the electric bias in the OFF period.

13. The plasma processing apparatus of claim 12, wherein the controller is further configured to control the second bias power source to apply a third negative voltage of a voltage level has a third absolute value larger than the second absolute value to the upper electrode in the OFF period.

14. The plasma processing apparatus of claim 11, wherein the upper electrode includes:

a ceiling plate in contact with a plasma processing space in the chamber; and a cooling plate including a refrigerant flow path in the cooling plate, and installed on the ceiling plate.

15. The plasma processing apparatus of claim 14, wherein the ceiling plate is made of silicon.

16. The plasma processing apparatus of claim 11, wherein the controller is further configured to perform the second control when at least one of the light emission intensity, the potential, or the current value, which is specified from the detection signal, is at a threshold or greater than the threshold, or exceeds the threshold.

17. The plasma processing apparatus of claim 11, wherein the controller is further configured to perform the second control if at least one of a first difference value between the light emission intensity specified from the detection signal and a normal value of the light emission intensity, a second difference value between the potential specified from the detection signal and a normal value of the potential, or a third difference value of the current value specified from the detection signal and a normal value of the current value is at a threshold or greater than the threshold, or exceeds the threshold.

18. A control method comprising:

supplying a source radio-frequency power from a radio-frequency power source to a radio-frequency electrode, which is a substrate support in a chamber of a plasma processing apparatus or an upper electrode disposed above the substrate support, to generate plasma from a gas in the chamber in an ON period;

supplying an electric bias to the substrate support from a first bias power source to the substrate support to draw ions in the chamber into a substrate on the substrate support in the ON period;

performing a first control if it is determined that a possibility of discharge in the upper electrode does not exist from a signal representing a light emission intensity in a gas hole for monitoring among a plurality of gas holes of the upper electrode, through which the gas is introduced into the chamber, or a detection signal which is a signal representing a potential or current value of the upper electrode; and performing a second control if it is determined from the detection signal that the possibility of discharge in the upper electrode exists, wherein the second control includes:

applying a first negative voltage of which a voltage level has a first absolute value from a second bias power source to the upper electrode in a first period including a start time point of the ON period; and applying a second negative voltage of which a voltage level has a second absolute value from the second bias power source to the upper electrode in a second period after the first period in the ON period, wherein the first control includes applying the second negative voltage from the second bias power source to the upper electrode throughout the ON period, and wherein the first absolute value is smaller than the second absolute value.

* * * * *